(12) United States Patent
Takayama et al.

(10) Patent No.: US 12,090,529 B2
(45) Date of Patent: Sep. 17, 2024

(54) METHOD OF CLEANING STAGE IN PLASMA PROCESSING APPARATUS, AND THE PLASMA PROCESSING APPARATUS

(71) Applicant: TOKYO ELECTRON LIMITED, Tokyo (JP)

(72) Inventors: Takamitsu Takayama, Miyagi (JP); Junichi Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/104,522

(22) Filed: Feb. 1, 2023

(65) Prior Publication Data

US 2023/0173558 A1 Jun. 8, 2023

Related U.S. Application Data

(63) Continuation of application No. 17/103,918, filed on Nov. 24, 2020.

(30) Foreign Application Priority Data

Nov. 29, 2019 (JP) ................................. 2019-216210

(51) Int. Cl.
*B08B 7/00* (2006.01)
*H01J 37/32* (2006.01)

(52) U.S. Cl.
CPC ...... *B08B 7/0035* (2013.01); *H01J 37/32715* (2013.01); *H01J 37/32862* (2013.01); *H01J 2237/20235* (2013.01)

(58) Field of Classification Search
CPC .............. B08B 7/0035; H01J 37/32715; H01J 37/32862; H01J 2237/20235; H01J 37/32174; H01J 37/32642; H01L 21/68742

See application file for complete search history.

(56) References Cited

U.S. PATENT DOCUMENTS

| | | |
|---|---|---|
| 4,960,488 A | 10/1990 | Law et al. |
| 6,159,333 A | 12/2000 | Gupta et al. |
| 2001/0020521 A1* | 9/2001 | Henricson ............ D21C 9/1005 162/87 |

(Continued)

FOREIGN PATENT DOCUMENTS

| | | |
|---|---|---|
| JP | H17-78802 A | 3/1995 |
| JP | 2011-54825 A | 3/2011 |

*Primary Examiner* — Erin F Bergner
(74) *Attorney, Agent, or Firm* — XSENSUS LLP

(57) ABSTRACT

A method of cleaning a stage in a plasma processing apparatus including the stage on which a substrate is placed, a lifting mechanism configured to raise and lower the substrate with respect to the stage, and a high-frequency power supply connected to the stage, includes: separating the stage and the substrate from each other using the lifting mechanism; and after the separating the stage and the substrate from each other, removing a deposit deposited on the stage with plasma generated by supplying a high-frequency power from the high-frequency power supply to the stage. In the separating the stage and the substrate from each other, a separation distance between the stage and the substrate is set such that a combined impedance formed around an outer peripheral portion of the stage is lower than a combined impedance formed immediately above a central portion of the stage.

17 Claims, 5 Drawing Sheets

(56) References Cited

U.S. PATENT DOCUMENTS

| | | |
|---|---|---|
| 2006/0254717 A1 | 11/2006 | Kobayashi et al. |
| 2008/0194111 A1 | 8/2008 | Delgadino et al. |
| 2014/0231389 A1* | 8/2014 | Nagami ............ H01J 37/32706 |
| | | 156/345.28 |
| 2018/0158717 A1 | 6/2018 | Hanzlik et al. |
| 2019/0157051 A1 | 5/2019 | Belau et al. |
| 2020/0020521 A1* | 1/2020 | Wu .................. H01L 21/68742 |

* cited by examiner

METHOD OF CLEANING STAGE IN PLASMA PROCESSING APPARATUS, AND THE PLASMA PROCESSING APPARATUS

CROSS-REFERENCE TO RELATED APPLICATIONS

This application is a continuation of U.S. application Ser. No. 17/103,918, filed on Nov. 24, 2020, which claimed the benefit of priority from Japanese Patent Application No. 2019-216210, filed on Nov. 29, 2019, the entire contents of each of which are incorporated herein by reference.

TECHNICAL FIELD

Embodiments disclosed herein relate to a method of cleaning a stage in a plasma processing apparatus, and the plasma processing apparatus.

BACKGROUND

Conventionally, in a plasma processing apparatus, there is known a technique for removing deposits deposited on a stage on which a substrate such as a semiconductor wafer is placed using plasma.

PRIOR ART DOCUMENT

Patent Document

Patent Document 1: Japanese Laid-Open Patent Publication No. 2011-054825
Patent Document 2: Japanese Laid-Open Patent Publication No. H07-078802

SUMMARY

According to one embodiment of the present disclosure, there is provided a method of cleaning a stage in a plasma processing apparatus including the stage on which a substrate is placed, a lifting mechanism configured to raise and lower the substrate with respect to the stage, and a high-frequency power supply connected to the stage, the method including: separating the stage and the substrate from each other using the lifting mechanism; and after the separating the stage and the substrate from each other, removing a deposit deposited on the stage with plasma generated by supplying a high-frequency power from the high-frequency power supply to the stage, wherein, in the separating the stage and the substrate from each other, a separation distance between the stage and the substrate is set such that a combined impedance formed around an outer peripheral portion of the stage is lower than a combined impedance formed immediately above a central portion of the stage

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
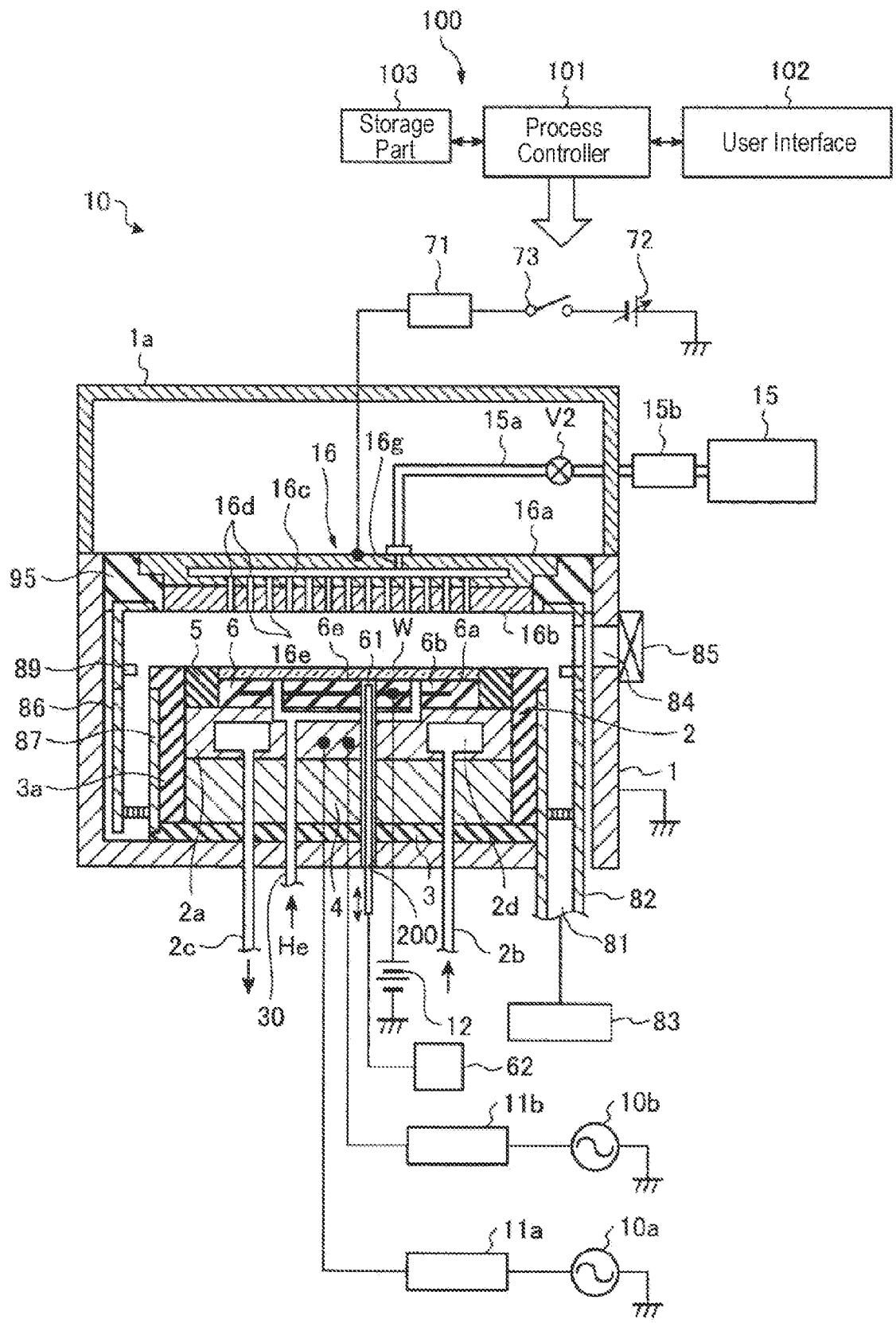
FIG. 1 is a schematic cross-sectional view illustrating a configuration of a plasma processing apparatus according to an embodiment.

Hereinafter, embodiments of a method of cleaning a stage in a plasma processing apparatus and the plasma processing apparatus disclosed herein will be described with reference to the drawings. It should be noted that the present disclosure is not limited by the embodiments. Respective embodiments may be appropriately combined unless a conflict arises. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Conventionally, a plasma processing apparatus, which performs plasma processing on a substrate such as a semiconductor wafer, has been known. Such a plasma processing apparatus has, for example, a stage provided within a processing container capable of forming a vacuum space therein and configured to place a substrate thereon. Lifter pins are accommodated in the stage, and the plasma processing apparatus delivers the substrate using the lifter pins.

In the plasma processing apparatus, by performing the plasma processing, deposits formed of reaction products such as a CF-based polymer are deposited on a placement surface of the stage. The deposition of the deposits on the placement surface may cause abnormalities in which attraction of the substrate is defective. For this reason, in the plasma processing apparatus, dry cleaning is performed so as to remove the deposits deposited on the placement surface through the plasma processing.

Here, for example, when the diameter of the placement surface is smaller than that of the wafer, the reaction products of processing gases used for the plasma processing may enter a gap between the outer peripheral portion of the stage and the rear surface of the wafer, so that the deposits may be locally deposited on the outer peripheral portion of the stage. In addition, a structure such as a focus ring or the like is disposed around the outer peripheral portion of the stage. Therefore, the outer peripheral portion of the stage is less likely than the central portion of the stage to come into contact with the plasma. Therefore, the deposits tend to remain on the outer peripheral portion of the stage after the dry cleaning.

As described above, the deposits tend to be deposited on the outer peripheral portion of the stage more than the central portion of the stage.

For example, it is conceivable to lengthen a dry cleaning time in order to remove the deposits deposited on the outer peripheral portion of the stage. However, when the dry cleaning time is lengthened, damage to the stage may be increased, which shortens the lifespan of the stage.

Therefore, it is expected to remove deposits deposited on a stage while suppressing damage to the stage.

[Configuration of Plasma Processing Apparatus]

FIG. 1 is a schematic cross-sectional view illustrating a configuration of a plasma processing apparatus 10 according to an embodiment. The plasma processing apparatus 10 includes a processing container 1, which is configured to be airtight and is electrically set to a ground potential. The processing container 1 has a cylindrical shape, and is made of, for example, aluminum. The processing container 1 defines a processing space in which plasma is generated. A stage 2 configured to horizontally support thereon a semiconductor water (hereinafter, simply referred to as a "wafer") W as a substrate (workpiece) is provided inside the processing container 1. The stage 2 includes a base 2a and an electrostatic chuck (FSC) 6, The base 2a is made of a conductive metal, such as aluminum, and functions as a lower electrode. The electrostatic chuck 6 has a function of electrostatically attracting the wafer W. The electrostatic chuck 6 is arranged on the upper surface of the base 2a. The stage 2 is supported on a support table 4. The support table 4 is supported by a support member 3 made of, for example, quartz.

A focus ring 5 made of, for example, single-crystal silicon, is provided on an upper outer periphery of the stage 2. Specifically, the focus ring 5 is formed in an annular shape, and is arranged on the upper surface of the base 2a so as to surround the outer periphery of the placement surface (the upper surface of the electrostatic chuck 6) of the stage 2. Inside the processing container 1, a cylindrical inner wall member 3a made of, for example, quartz is provided so as to surround the periphery of the stage 2 and the support table 4.

A first RF power supply 10a is connected to the base 2a via a first matcher 11a, and a second RF power supply 10b is connected to the base 2a via a second matcher 11b. The first RF power supply 10a is for plasma generation, and is configured to supply high-frequency power of a predetermined frequency to the base 2a of the stage 2. The second RF power supply 10b is for ion drawing (for bias), and is configured to supply high-frequency power of a predetermined frequency lower than that of the first RF power supply 10a, to the base 2a. of the stage 2. As described above, the stage 2 is configured to be capable of applying a voltage. Meanwhile, above the stage 2, a shower head 16 functioning as an upper electrode is provided to face the stage 2 in a parallel relationship to the stage 2. The shower head 16 and the stage 2 function as a pair of electrodes (the upper electrode and the lower electrode).

The electrostatic chuck 6 has an upper surface formed in a flat disc shape and used as a placement surface 6e on which the wafer W is placed. The electrostatic chuck 6 is configured such that an electrode 6a is interposed between the electrostatic chuck 6 and an insulator 6b. A DC power supply 12 is connected to the electrode 6a. In addition, the electrostatic chuck 6 is configured to attract the wafer W by virtue of Coulomb force when a DC voltage is applied to the electrode 6a from the DC power supply 12.

In the present embodiment, as an example, the diameter of the placement surface 6e is slightly smaller than that of the wafer W.

A temperature-control-medium flow path 2d is formed inside the stage 2. An inlet pipe 2b and an outlet pipe 2c are connected to the temperature-control-medium flow path 2d. In addition, the stage 2 is configured such that the temperature thereof can be controlled to a predetermined temperature by circulating an appropriate temperature control medium such as cooling water through the temperature-control-medium flow path 2d. Further, a gas supply pipe 30 configured to supply a cold-heat transfer gas (a backside gas) such as a helium gas to the rear surface of the wafer W is provided so as to penetrate the stage 2 and the like. The gas supply pipe 30 is connected to a gas source (not illustrated). With these configurations, the temperature of the wafer W held on the upper surface of the stage 2 by suction of the electrostatic chuck 6 is controlled to a predetermined temperature.

The stage 2 is provided with a plurality of (e.g., three) pin through-holes 200 formed therein (only one of which is illustrated in FIG. 1). Lifter pins 61 are arranged inside the respective pin through-holes 200. The lifter pins 61 are connected to a lifting mechanism 62. The lifting mechanism 62 raises and lowers the lifter pins 61 so as to move the lifter pins 61 upward and downward on the placement surface 6e of the stage 2. When the lifter pins 61 are raised, tips of the lifter pins 61 protrude from the placement surface 6e of the stage 2 so that the water W is held above the placement surface 6e of the stage 2. On the other hand, when the lifter pins 61 is lowered, the tips of the lifter pins 61 are accommodated in the respective pin through-holes 200, so that the wafer W is placed on the placement surface 6e of the stage 2. In this way, the lifting mechanism 62 raises and lowers the wafer W with respect to the placement surface 6e of the stage 2 using the lifter pins 61, in addition, in the state in which the lifter pins 61 are raised, the lifting mechanism 62 holds the wafer W above the placement surface 6e of the stage 2 using the lifter pins 61.

The shower head 16 is provided on the ceiling wall portion of the processing container 1. The shower head 16 includes a main body 16a and an upper ceiling plate 16b serving as an electrode plate, and is supported on the upper portion of the processing container 1 via an insulating member 95. The main body 16a is made of a conductive material such as aluminum having an anodized surface, and is configured to be capable of detachably supporting the upper ceiling plate 16b thereunder.

A gas diffusion chamber 16c is provided inside the main body 16a. A number of gas flow holes 16d are formed in the main body 16a so as to be located below the gas diffusion chamber 16c. The upper ceiling plate 16h includes gas introduction holes 16e penetrating the upper ceiling plate 16b in the thickness direction thereof and provided to overlap the gas flow holes 16d described above. With this configuration, the processing gas supplied to the gas diffusion chamber 16c is dispersedly supplied into the processing container 1 in the form of a shower through the gas flow holes 16d and the gas introduction holes 16e.

The main body 16a has a gas inlet 16g formed therein to introduce the processing gas into the gas diffusion chamber 16c. One end of a gas supply pipe 15a is connected to the gas inlet 16g. A gas source (a gas supply part) 15 configured to supply the processing gas is connected to the other end of the gas supply pipe 15a. The gas supply pipe 15a. is provided with a mass flow controller (WC) 15b and an opening/closing valve V2 in that order from the upstream side. A processing gas for plasma etching is supplied from the gas source 15 to the gas diffusion chamber 16c through the gas supply pipe 15a. The processing gas is dispersedly supplied into the processing container 1 in the form of a shower from the gas diffusion chamber 16c through the gas flow holes 16d and the gas introduction holes 16e.

A variable DC power supply 72 is electrically connected to the shower head 16 serving as the upper electrode via a low pass filter (LPF) 71. The variable DC power supply 72 is configured to be capable of turning on/off power through an on/off switch 73. The current/voltage of the variable DC power supply 72 and the on/off operation of the on/off switch 73 are controlled by a controller 100 to be described later. As will be described later, when high-frequency waves are applied to the stage 2 from the first RF power supply 10a. and the second RF power supply 10b and plasma is generated in the processing space, the on/off switch 73 is turned on by the controller 100, if necessary. As a result, a predetermined DC voltage is applied to the shower head 16 serving as the upper electrode.

A cylindrical ground conductor 1a is provided so as to extend from the side wall of the processing container 1 to a position above the height position of the shower head 16. The cylindrical ground conductor 1a has a ceiling wall on the top thereof.

An exhaust port 81 is formed in the bottom portion of the processing container 1. A first exhaust device 83 is connected to the exhaust port 81 through an exhaust pipe 82. The first exhaust device 83 has a vacuum pump, and is configured to operate the vacuum pump so as to reduce an internal pressure of the processing container 1 to a predetermined degree of vacuum. Meanwhile, a loading/unloading port 84 for the wafer W is provided in the side wall in the processing container 1. A gate valve 85 is provided in the loading/unloading port 84 to open/close the loading/unloading port 84.

A deposit shield 86 is provided inward of the side portion of the processing container 1 along the inner wall surface of the processing container 1. The deposit shield 86 prevents etching byproducts (deposits) from adhering to the processing container 1. At substantially the same height position as the wafer W, the deposit shield 86 is provided with a conductive member (a GND block) 89, which is connected such that the potential thereof with respect to the ground is controllable, thereby preventing abnormal discharge. Further, at the lower end of the deposit shield 86, a deposit shield 87 is provided to extend along the inner wall member 3a. The deposit shields 86 and 87 are detachable.

The operation of the plasma processing apparatus 10 configured as above is entirely controlled by the controller 100. The controller 100 is provided with a process controller 101 configured to control each part of the plasma processing apparatus 10, a user interface 102, and a storage part 103.

The user interface 102 includes, for example, a keyboard that allows a process manager to input commands for managing the plasma processing apparatus 10 therethrough, and a display that visually displays the operation situation of the plasma processing apparatus 10.

The storage part 103 stores recipes in which, for example, control programs (software) for implementing various processes executed in the plasma processing apparatus 10 under the control of the process controller 101 and processing condition data are described. In addition, if necessary, by an arbitrary recipe from the storage part 103 using, for example, an instruction from the user interface 102 and causing the process controller 101 to execute the recipe, a desired process is performed by the plasma processing apparatus 10 under the control of the process controller 101. In addition, the recipes such as the control programs or the processing condition data may be used in the state of being stored in a non-transitory computer-readable storage medium (e.g., a hard disc, a CD, a flexible disc, a semiconductor memory or the like) that is capable of being read by a computer. The recipes such as the control programs or the processing condition data may be transmitted from another device at any time via a dedicated line and may be used in an online environment

[Cleaning Process]

Figure 2:
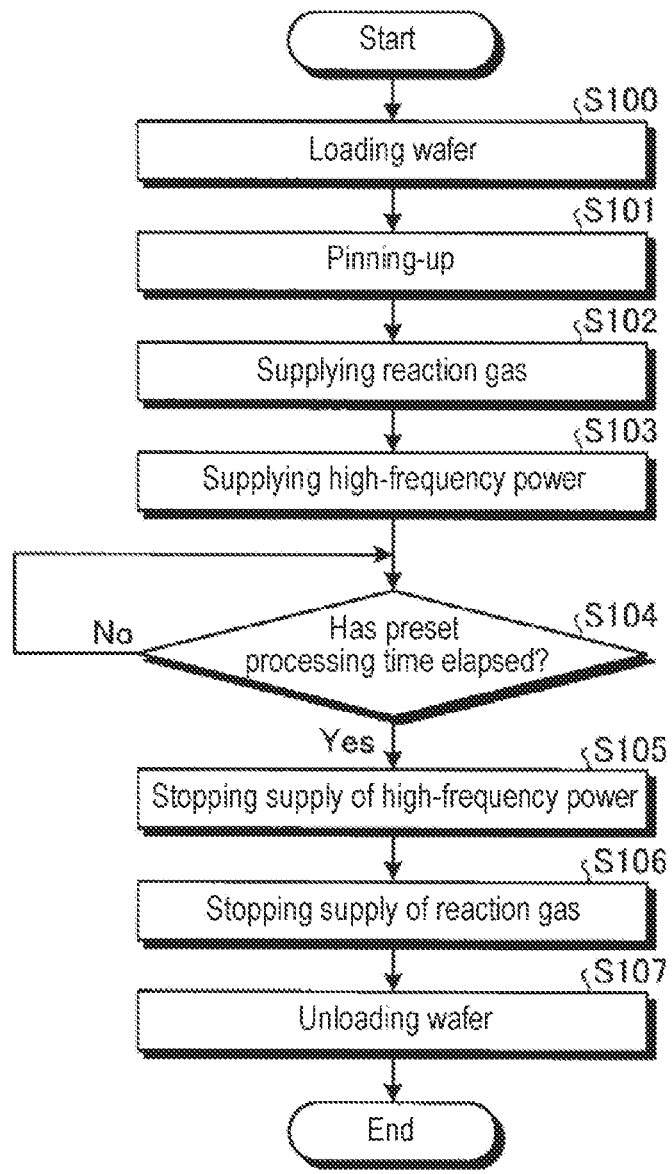
FIG. 2 is a flowchart illustrating an example of a cleaning process.

Next, the content of an example of a cleaning process executed by the plasma processing apparatus 10 according to the embodiment will be described with reference to FIG. 2. FIG. 2 is a flowchart illustrating an example of the cleaning process. The cleaning process illustrated in FIG. 2 is implemented mainly by operating the plasma processing apparatus 10 under the control of the controller 100.

The wafer W used for the cleaning process may be a product wafer or a dummy wafer.

First, the wafer W is loaded into the processing container 1 (S100). In step S100, the gate valve 85 is opened, and the wafer W is loaded into the processing container 1 by a transfer arm (not illustrated) and is placed on the placement surface 6e of the stage 2. Specifically, in step S100, the lifter pins 61 are in a raised state, and the wafer W is delivered from the transfer arm to the lifter pins 61. Thereafter, as the lifter pins 61 are lowered, the wafer W is delivered from the lifter pins 61 to the placement surface 6e. Thereafter, the gate valve 85 is closed.

Subsequently, the wafer W is separated from the placement surface 6e by raising (pinning up) the lifter pins 61 (S101), Information on the separation distance between the wafer W and the placement surface 6e is stored in advance in the storage part 103. The controller 100 raises the lifter pins 61 according to the information stored in the storage part 103.

Here, an example is described in which the wafer W is placed once on the placement surface 6e in step S101 and then the wafer W is raised to a set separation distance in step S101. Without being limited to this example, for example, in step S101, after receiving the wafer W using the lifter pins 61, by lowering the lifter pins 61, the wafer W may be disposed at a height position at which the separation distance between the wafer W and the placement surface 6e becomes a preset distance. The separation distance between the wafer W and the placement surface 6e in step S101 is smaller than at least the distance from the placement surface 6e to the height position where the lifter pins 61 receive the wafer W in step S100.

Subsequently, after the inside of the processing container 1 is depressurized to a predetermined degree of vacuum by the first exhaust device 83, a reaction gas is supplied from the gas source 15 into the processing container 1 through the gas supply pipe 15a (S102). In the present embodiment, when the deposits to be cleaned are a CF-based polymer, the reaction gas supplied from the gas source 15 is an $O_2$ gas. The reaction gas is not limited to the $O_2$ gas, but may be other oxygen-containing gases such as a CO gas, a $CO_2$ gas, and an $O_3$ gas. When the deposits contain silicon or a metal in addition to the CF-based polymer, for example, a halogen-containing gas may be added to the reaction gas (the $O_2$ gas). The halogen-containing gas is, for example, a fluorine-based gas such as a $CF_4$ gas, a $NF_3$ gas or the like. In addition, the halogen-containing gas may be a chlorine-based gas such as a Cl₂ gas or a bromine-based gas such as a HBr gas. As described above, in the cleaning process, the oxygen-containing gas is used as the reaction gas.

Subsequently, high-frequency power is supplied to the stage 2, which is the lower electrode (S103). In step S103, the controller 100 controls the first RF power supply 10*a* and the second RF power supply 10*b* to generate the high-frequency power, thereby supplying the high-frequency power to the base 2*a* of the stage 2. In addition, the controller 100 applies the DC power supplied from the variable DC power supply 72 to the shower head 16 by turning on the on/off switch 73. As a result, plasma of the oxygen-containing gas is generated within the processing container 1. The frequency of the high-frequency power generated by the first RF power supply 10*a* and the second RF power supply 10*b* is not particularly limited. Here, an example is described in which the plasma processing apparatus 10 includes the first RF power supply 10*a* and the second RF power supply 10*b*, but the plasma processing apparatus 10 does not necessarily include the second RF power supply 10*b*.

Subsequently, the controller 100 determines whether or not a preset processing time has elapsed since the supply of the high-frequency power was started in step S103 (S104). When the set processing time has not elapsed (S104: "No"), the process in step S104 is executed again.

On the other hand, when the set processing time has elapsed (S104: "Yes"), the supply of the high-frequency power to the stage 2 is stopped (S105). In addition, the supply of the reaction gas into the processing container 1 is stopped (S106).

Then, after the reaction gas inside the processing container 1 is exhausted, the gate valve 85 is opened, and the wafer W is unloaded from the processing container 1 by the transfer arm (not illustrated) (S107). Specifically, the controller 100 raises the lifter pins 61 to locate the wafer W at the delivery position, and delivers the water W supported by the lifter pins 61 to the transfer arm. In this way, the cleaning method illustrated in this flowchart is completed.

[Plasma Generated in the Cleaning Process]

Figure 3:
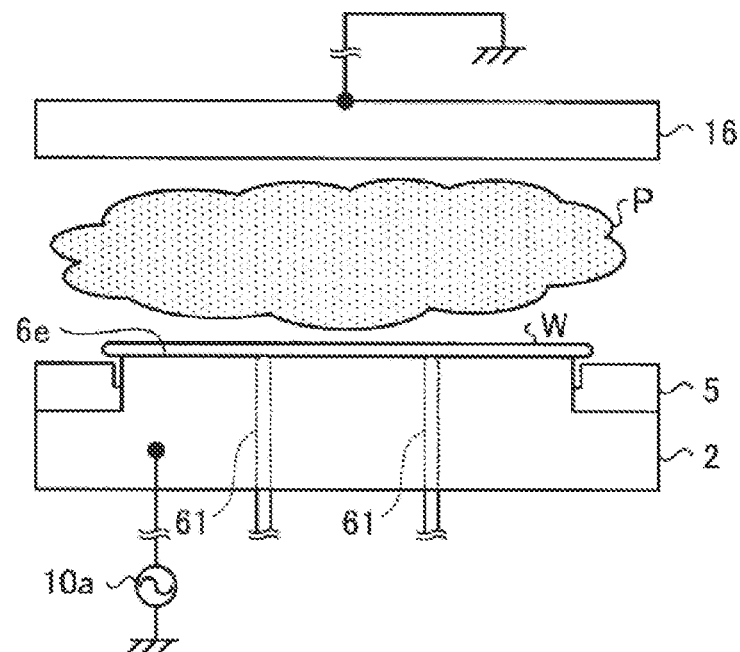
FIG. 3 is a view illustrating an example of distribution of plasma generated when high-frequency power is supplied in a state in which a wafer is placed on a stage.
Figure 4:
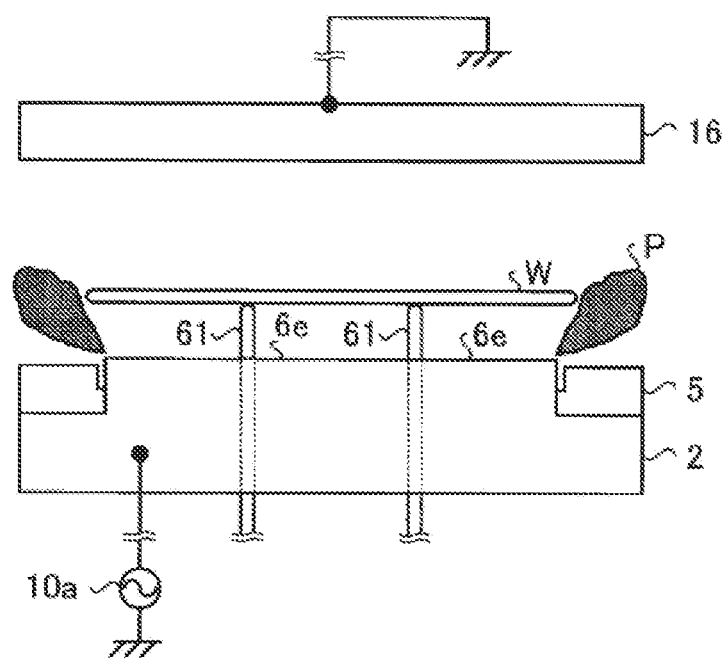
FIG. 4 is a view illustrating an example of distribution of plasma generated when high-frequency power is supplied in the state in which the wafer is separated from the stage.

FIG. 3 is a view illustrating an example of a distribution of plasma generated when the high-frequency power is supplied in the state in which the wafer W is placed on the stage 2. FIG. 4 is a view illustrating an example of the distribution of plasma generated when the high-frequency power is supplied in the state in which the wafer W is separated from the stage 2.

As illustrated in FIG. 3, when the high-frequency power is supplied from the first RF power supply 10*a* to the stage 2 in the state in which the wafer W is placed on the stage 2, the plasma P is evenly distributed in the in-plane direction of the wafer W in the depressurized space between the wafer W and the shower head 16.

In this regard, the present inventors found that the plasma P can he unevenly distributed around the outer peripheral portion of the stage 2, as illustrated in FIG. 4, by separating the wafer W from the placement surface 6*e* and appropriately setting the separation distance.

Such a mechanism may be explained, for example, as follows. That is, when the water W and the placement surface 6*e* are separated from each other, a depressurized space is also formed between the wafer W and the placement surface 6*e*. This depressurized space may be regarded as a capacitor provided on the high-frequency power path from the first RF power supply 10*a* to the ground connected to the shower head 16 via the stage 2. This capacitor is a portion of the combined impedance on the high-frequency power path from the first RF power supply 10*a* to the ground.

Here, the high-frequency power path from the stage 2 to the shower head 16 is considered to be divided into a path directly above the central portion of the stage 2 and a path above the outer peripheral portion of the stage 2 (hereinafter, referred to as a "central path" and an "outer peripheral path"). As illustrated in FIG. 3, in the state in which the wafer W is placed on the stage 2, the combined impedance per unit area on the placement surface 6*e* is substantially the same in the central path and the outer peripheral path. On the other hand, as illustrated in FIG. 4, when the wafer W and the placement surface 6*e* are separated from each other, the outer peripheral path becomes a path parallel to a path that passes through the wafer W and a path that does not pass through the wafer W outside the wafer W. The path that passes through the wafer W is a path that passes a capacitor formed in the depressurized space between the wafer W and the placement surface 6*e*, and the path that does not pass through the wafer W is a path that does not pass through the capacitor.

Therefore, the combined impedance per unit area formed by the two parallel high-frequency power paths around the outer peripheral portion of the placement surface 6*e* is lower than the combined impedance per unit area formed just above the central portion of the placement surface 6*e*.

The high-frequency power flows intensively around the outer peripheral portion of the placement surface 6*e* in which the combined impedance is relatively low. As a result, the density of the plasma P around the outer peripheral portion of the placement surface 6*e* becomes higher than the density of the plasma Pin the central portion of the placement surface 6*e*, so that a ring-shaped plasma P is formed around the outer peripheral portion of the placement surface 6*e*.

In the cleaning process according to the embodiment, by using the plasma P unevenly distributed around the outer peripheral portion of the stage 2, it is possible to efficiently remove deposits deposited on the outer peripheral portion of the stage 2. That is, with the cleaning process according to the embodiment, since the plasma P is concentrated around the outer peripheral portion of the stage 2, it is possible to enhance the force for removing the deposits deposited on the outer peripheral portion of the stage 2. Therefore, it is possible to reliably remove the deposits deposited on the outer peripheral portion of the stage 2 in a short period of time. In addition, since the density of the plasma P is relatively low in portions other than the outer peripheral portion, it is possible to suppress damage by the plasma P to portions other than the outer peripheral portion of the stage 2.

As described above, with the cleaning process according to the embodiment, it is possible to remove the deposits deposited on the outer peripheral portion of the stage 2 while suppressing damage to the stage 2.

Furthermore, with the cleaning process according to the embodiment, it is possible to efficiently remove the deposits deposited on the outer peripheral portion of the stage 2 without providing an electrode having a special structure for generating local plasma on the outer peripheral portion of the stage.

Among the deposits deposited on the outer peripheral portion of the stage 2, the CF-based polymer deposits can be removed by the plasma of the oxygen-containing gas such as the $O_2$ gas. Further, Si-based or metal-based deposits can be removed by the plasma of the halogen-containing gas such as the $CF_4$ gas, the $NF_3$ gas, the $Cl_2$ gas, or the HBr gas. In addition, mixed deposits of the CF-based polymer deposits and at least one of Si-based deposits and metal-based mixed deposits can be removed by the plasma of a mixed gas of the oxygen-containing gas and the halogen-containing gas. The CF-based polymer deposits can also be removed by a hydrogen-containing gas such as a $H_2$ gas or a nitrogen-containing gas such as $N_2$. A noble gas such as an argon gas, a helium gas or the like may also be added.

Figure 5:
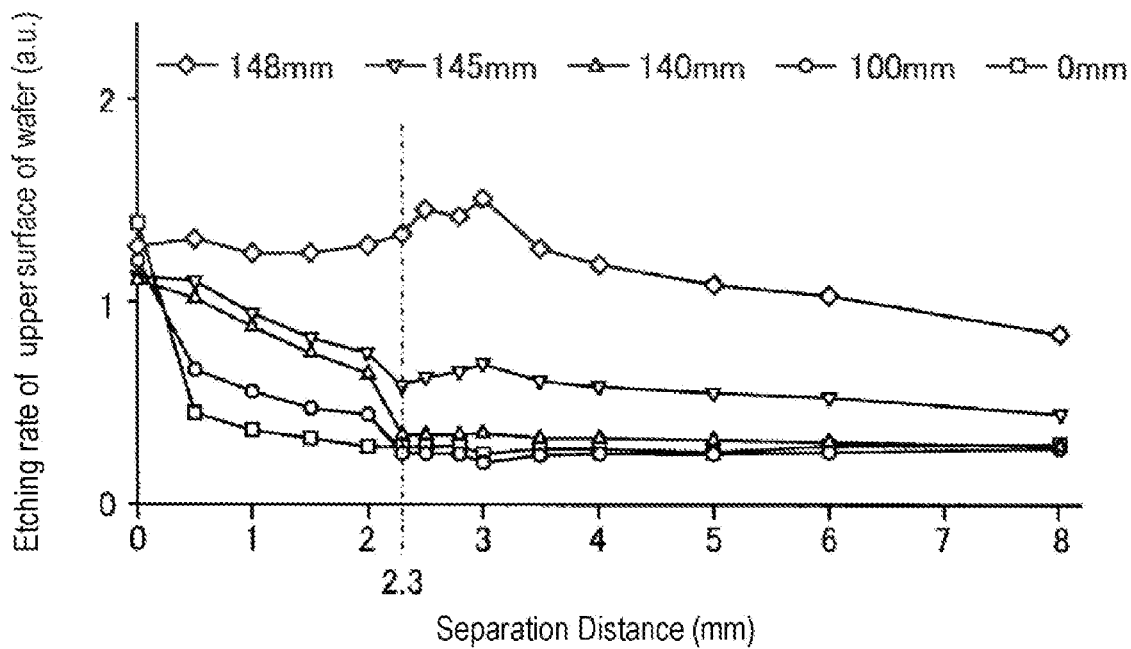
FIG. 5 is a graph showing a relationship between a separation distance between the wafer and a placement surface and an etching rate of a resist film at respective positions on the upper surface of the wafer.

The present inventors conducted a test in which, when the wafer W coated with a resist film (as a substitute for the CF-based polymer deposits, which is an organic film like the CF-based polymer deposits) was processed with plasma of an $O_2$ gas, where the etching rate of the resist film was examined at each position on the upper surface of the wafer W. The results of this test are shown in FIG. 5. FIG. 5 is a graph showing a relationship between a separation distance between the wafer W and the placement surface 6e and an etching rate of the resist film at respective positions on the upper surface of the wafer W.

Figure 6:
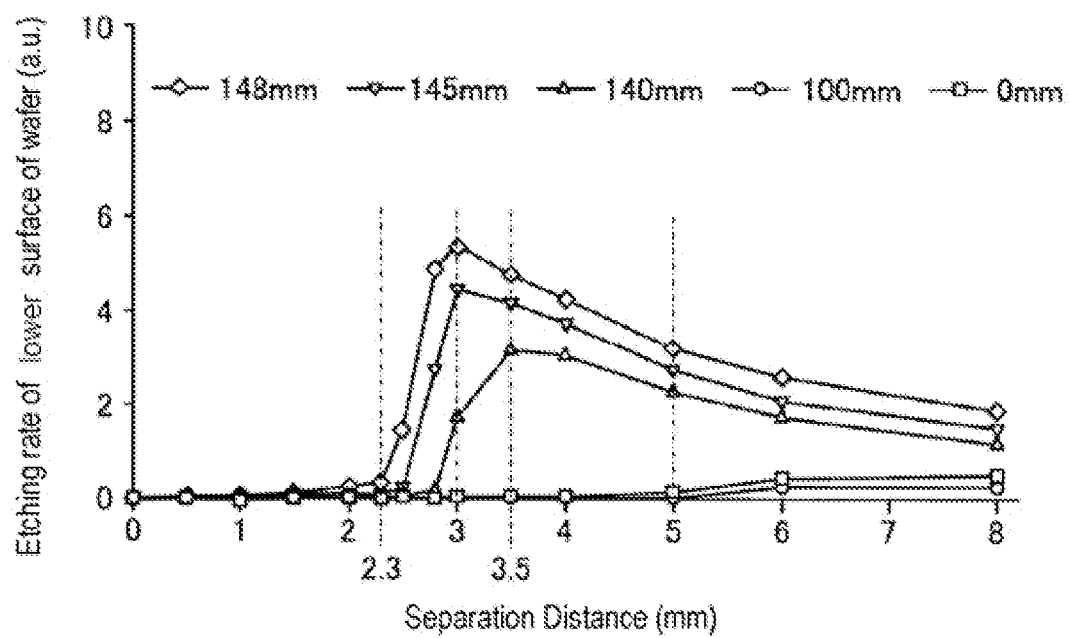
FIG. 6 is a graph showing a relationship between a separation distance between the wafer and the placement surface and an etching rate of a resist film at respective positions on the lower surface of the wafer.

In addition, the present inventors conducted the same test as the above-described test in the state in which the surface of the wafer W coated with the resist film faces the placement surface 6e. That is, the test was conducted to examine the etching rate of the resist film at respective positions on the lower surface (the surface coated with the resist film) of the wafer W when the wafer W was processed with the plasma of the $O_2$ gas. The results of this test are shown in FIG. 6. FIG. 6 is a graph showing a relationship between a separation distance between the wafer W and the placement surface 6e and an etching rate of the resist film at respective positions on the lower surface of the wafer W.

The processing conditions of the test results shown in FIGS. 5 and 6 are as follows.

Internal pressure of processing container 1: 100 to 800 mT

High-frequency power: 1,000 W or less

Gas type: $O_2$ gas

Diameter of wafer W: 300 mm

Processing time: 30 sec

In addition, in the legends in FIGS. 5 and 6, each etching rate measurement position is indicated by a distance from the center of the wafer W. For example, the center of the wafer W is 0 mm.

As shown in FIG. 5, when the separation distance is smaller than 2.3 mm, the etching rate increases at 0 mm, which is the central portion of the wafer W (indicated by square plots in FIG. 5), and 100 mm, which is relatively close to the central portion (indicated by circle plots in FIG. 5). From this result, it can be seen that when the separation distance is smaller than 2.3 mm, the plasma spreads near the central portion of the upper surface of the wafer W.

Further, as shown in FIG. 6, when the separation distance is smaller than 2.3 mm, almost no etching is performed at 148 mm, which is the outer peripheral portion of the wafer W (indicated by diamond-shaped plots in FIG. 6), and 145 mm. which is relatively close to the outer peripheral portion (indicated by inverted triangular plots in FIG. 6). The placement surface 6e of the stage 2 has substantially the same (slightly smaller) diameter as the wafer W. Therefore, from these results, it can be seen that when the separation distance is smaller than 2.3 mm, almost no plasma is generated between the wafer W and the placement surface 6e.

Meanwhile, as shower in FIG. 6, when the separation distance is larger than 5 mm, the etching rate increases at 0 mm and 100 mm which are near the central portion of the wafer W. From this result, it can be seen that when the separation distance is set to be larger than 5 mm, the plasma spreads near the central portion of the lower surface of the wafer W, namely near the central portion of the placement surface 6e.

From the above results, the separation distance between the wafer W and the placement surface 6e is preferably in a range of 2.3 mm to 5 mm. By setting the separation distance in such a range, the plasma can be appropriately unevenly distributed around the outer peripheral portion of the stage 2. That is, it is possible to generate ring-shaped plasma around the outer peripheral portion of the stage 2 while protecting the central portion of the stage 2 from the plasma.

In addition, as shown in FIG. 6, the etching rates at 148 mm and 145 mm, which are positions near the outer peripheral portion of the wafer W, are maximized when the separation distance is 3 mm. From these results, the separation distance between the wafer W and the placement surface 6e is preferably in a range of 2.3 mm to 3.5 mm, and more preferably in a range of 2.3 mm to 3 mm. By setting the separation distance in such a range, it is possible to reliably remove deposits deposited on the outer peripheral portion of the stage 2 in a short period of time.

As described above, the separation distance between the wafer W and the placement surface 6e set in the present embodiment is small. The separation distance between the wafer W and the placement surface 6e is smaller than at least a sheath thickness of plasma generated between the wafer W and the shower head 16 in the cleaning process.

Figure 7:
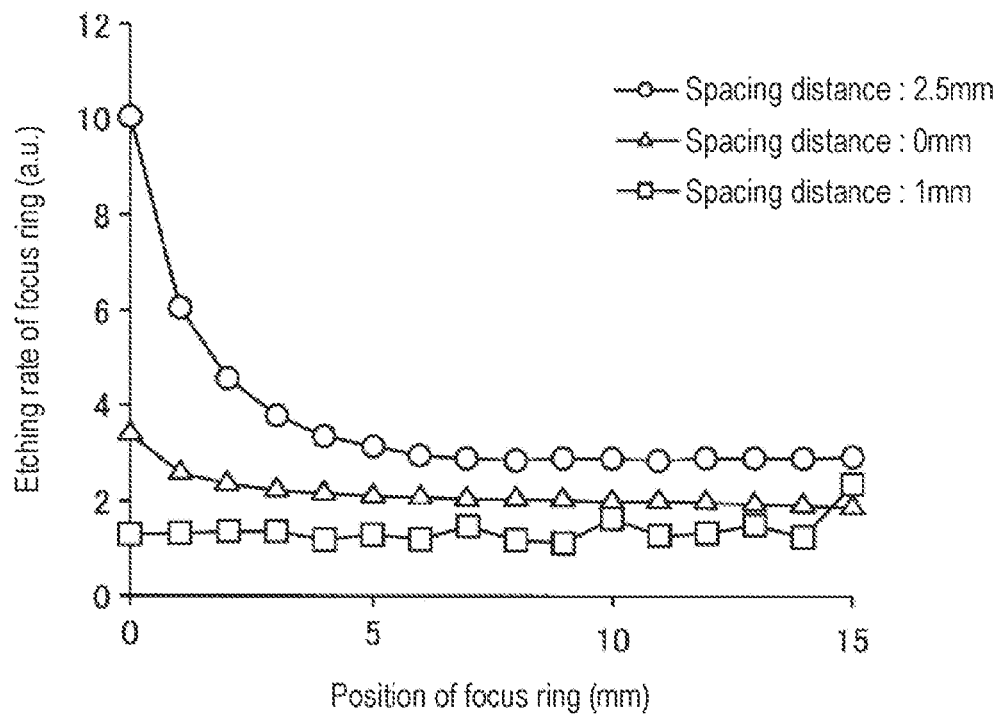
FIG. 7 is a graph showing a relationship between a separation distance between a wafer and a placement surface and an etching rate of a resist film at respective positions on a focus ring.

In order to examine the state of plasma outside the wafer W, the present inventors conducted a test in which a chip-shaped wafer W coated with the resist film was attached on the focus ring 5 and the etching rate of the resist film was examined at each position on the upper surface of the chip-shaped wafer W. The results of this test are shown in FIG. 7. FIG. 7 is a graph showing a relationship between the separation distance between the wafer W and the placement surface 6e and the etching rate of the resist film at respective positions on the focus ring 5. The processing conditions of the test results shown in FIG. 7 are similar to those of the test results shown in FIGS. 5 and 6.

In the graph shown in FIG. 7, the horizontal axis represents the position of the focus ring. The position of the focus ring refers to a measurement position at which the etching rate on the focus ring 5 is measured, and is indicated by the distance from the inner edge of the upper surface of the focus ring 5. For example, the inner edge of the upper surface of the focus ring 5 closest to the placement surface 6e of the stage 2 is 0 mm. In the graph shown in FIG. 7, the horizontal axis represents the distance from the placement surface 6e. In FIG. 7, the distance is plotted in the range of 15 mm.

In the graph shown in FIG. 7, the vertical axis represents the etching rate of the resist film on the focus ring 5. Specifically, the etching rate of a predetermined material placed on the upper surface of the focus ring 5 is shown as the etching rate of the focus ring.

As shown in FIG. 7, when the separation distance between the wafer W and the placement surface 6e is 0 mm (indicated by triangular plots in FIG. 7) and 1 mm (indicated by square plots in FIG. 7), which are less than 2.3 mm, the etching rate of the resist film on the focus ring 5 is low. On the other hand, when the separation distance is 2.5 mm (indicated by circle plots in FIG. 7), which is equal to or larger than 2.3 mm, the etching rate of the resist film on the focus ring 5 was higher than those obtained when the separation distances are 0 mm and 1 mm. In addition, the etching rate was high in the inner peripheral portion near the stage 2.

From these results, it can be seen that by setting the separation distance between the wafer W and the placement surface 6e to 2.3 mm or more, plasma having a high density is generated around the outer peripheral portion of the placement surface 6e, specifically, in the region including the outer peripheral portion of the placement surface 6e and the inner peripheral portion of the upper surface of the focus ring 5.

When the separation distance is set to 2.5 mm, the etching rate of the resist film on the focus ring 5 is highest at the inner peripheral portion of the focus ring 5 near the stage 2, and becomes lower as the distance from the stage 2 increases.

From this result, it can be seen that the density of plasma generated in the cleaning process is higher in the inner peripheral portion than in the outer peripheral portion of the focus ring 5. That is, by setting the separation distance to 2.3 mm or more, it is possible to generate plasma around the outer peripheral portion of the placement surface 6e, specifically in a local region that includes the outer peripheral portion of the placement surface 6e and the inner peripheral portion of the upper surface of the focus ring 5, and does not include the outer peripheral portion of the upper surface of the focus ring 5.

[Modifications]

In the cleaning process described above, the plasma processing apparatus 10 may clean a structure other than the stage 2, including the inner wall of the processing container 1.

Fax example, the plasma processing apparatus 10 may perform a process of generating plasma within the processing container 1 and removing deposits deposited on the inner wall and the like of the processing container 1 using the generated plasma in the state in which the wafer W is placed on the placement surface 6e.

This process may be performed, for example, after the wafer W is loaded into the processing container 1 and placed on the placement surface 6e in step S100, and before the lifter pins 61 are raised in step S101. In this case, it is preferable to stop the supply of the high-frequency power and the reaction gas so as to eliminate the plasma before raising the lifter pins 61 in step S101. This is because ring-shaped plasma may not be properly formed around the outer peripheral portion of the stage 2 if the lifter pins 61 are raised in the state in which plasma is generated.

This process may be performed, for example, after the processing time set in step S104 has elapsed. In this case, after the processing time set in step S104 has elapsed, the lifter pins 61 may be lowered so as to place the wafer W on the placement surface 6e, and the plasma processing may continue in such a state.

In this way, by performing the cleaning process in the state in which the water W is placed on the stage 2, it is possible to remove the deposits deposited on the inner wall and the like of the processing container 1 while protecting the placement surface 6e using the wafer W.

The plasma processing apparatus 10 may perform a process of generating plasma within the processing container 1 and removing deposits deposited in the processing container 1 using the generated plasma in the state in which no wafer W is accommodated in the processing container 1.

This process may be performed, for example, before the wafer W is loaded into the processing container 1 in step S100. Even in such a case, it is preferable to stop the supply of the high-frequency power and the reaction gas so as to eliminate the plasma before loading the wafer W into the processing container 1 in step S100. This process may be performed after the wafer W is unloaded from the processing container 1 in step S107.

As described above, by performing the cleaning process in the state in which no wafer W is accommodated in the processing container 1, deposits deposited on a place other than the outer peripheral portion of the placement surface 6e can also be removed while the deposits deposited on the outer peripheral portion of the placement surface 6e are mainly removed. That is, it is possible to clean the entire placement surface 6e.

As described above, the cleaning method according to the present embodiment is a method of cleaning a stage in a plasma processing apparatus (e.g., the plasma processing apparatus 10) that includes the stage (e.g., the stage 2) on which a substrate e.g., the wafer W) is placed, a lifting mechanism configured to raise and lower the substrate with respect to the stage (e.g., the lifting mechanism 62), and a high-frequency power supply (e.g., the first RF power supply 10a) connected to the stage. The cleaning method according to the present embodiment includes a separation process and a removal process. The separation process separates the stage and the substrate from each other using the lifting mechanism. After the separation process, the removal process supplies the high-frequency power from the high-frequency power supply to the stage, thereby generating plasma and removing deposits deposited on the stage. Further, in the separation process, the separation distance between the stage and the substrate is set such that the combined impedance formed around the outer peripheral portion of the stage is lower than the combined impedance formed immediately above the central portion of the stage.

With the cleaning method according to the present embodiment the deposits deposited on the outer peripheral portion of the stage can be removed while suppressing damage to the stage since it is possible to cause the plasma to be unevenly distributed around the outer peripheral portion of the stage.

The separation distance between the stage and the substrate is smaller than the thickness of the sheath of the plasma generated in the removal process (e.g., the plasma generated between the wafer W and the shower head 16). That is, in the cleaning method according to the present embodiment, the separation distance between the stage and the substrate is small.

Specifically, the separation distance between the stage and the substrate is in a range of 2.3 mm to 5 mm, By setting the separation distance in such a range, it is possible to cause the plasma to be appropriately unevenly distributed around the outer peripheral portion of the stage. That is, it is possible to generate ring-shaped plasma around the outer peripheral portion of the stage while protecting the central portion of the stage from the plasma.

The separation distance between the stage and the substrate may be in a range of 2.3 mm to 3.5 mm, more specifically, in a range of 2.3 mm to 3 mm. By setting the separation distance in such a range, it is possible to reliably remove deposits deposited on the outer peripheral portion of the stage 2 in a short period of time.

The density of the plasma generated in the removal process is higher around the outer peripheral portion of the substrate than in the central portion of the substrate. Therefore, it is possible to remove deposits deposited on the outer peripheral portion of the stage while suppressing damage to the stage.

The plasma processing apparatus includes a ring member (e.g., the focus ring 5) provided to surround the outer periphery of the placement surface on the stage. In addition, the density of the plasma generated in the removal process is higher in the inner peripheral portion of the ring member than in the outer peripheral portion of the ring member, That is, with the cleaning method according to the present embodiment, it is possible to form ring-shaped plasma around the outer peripheral portion of the stage, specifically, in a local region that includes the outer peripheral portion of the stage and the inner peripheral portion of the ring member and does not include the outer peripheral portion of the ring member.

In the removal process, plasma of an oxygen-containing gas (e.g., the $O_2$ gas or the reaction gas in which a halogen gas is added to the $O_2$ gas) is generated. As a result, it is possible to suitably remove carbon-based deposits deposited on the outer peripheral portion of the stage.

The plasma processing apparatus includes a processing container (e.g., the processing container 1) configured to accommodate the stage therein. The cleaning method according to an embodiment includes a process of removing deposits deposited in the processing container using plasma in the state in which the substrate is placed on the stage before the separation process (e.g., before step S101) or after the removal process e.g., after step S104). This makes it possible to remove deposits adhering to the inner wall of the processing container while protecting the stage using the substrate.

The plasma processing apparatus includes a processing container (e.g., the processing container 1) configured to accommodate the stage therein. The cleaning method according to an embodiment includes a process of removing deposits deposited in the processing container using plasma in the state in which no substrate is accommodated in the processing container before the separation process (e.g., before step S100) or after the removal process (e.g., after step S107). This makes it possible to clean the entire placement surface of the stage.

According to the present disclosure, it is possible to remove deposits deposited on the outer peripheral portion of a stage while suppressing damage to the stage.

It should be noted that the embodiments disclosed herein are exemplary in all respects and are not restrictive. Indeed, the above-described embodiments can be implemented in various forms. The above-described embodiments may be omitted, replaced, or modified in various forms without departing from the scope and spirit of the appended claims.

What is claimed is:

1. A plasma processing apparatus, comprising:
a processing container having a loading/unloading port for a substrate, a gas inlet and a gas exhaust port;
a stage disposed in the processing container;
a lifter pin which raises and lowers with respect to a position of the stage;
a plasma generator to generate plasma in the processing container;
a memory which stores a predetermined separation distance between a dummy substrate and a placement surface of the stage; and
controller circuitry configured to, following a plasma processing of the substrate in the processing container:
control for the substrate to be unloaded from the processing container through the loading/unloading port;
control the plasma generator to generate a first plasma, from a first cleaning gas supplied through the gas inlet into the processing container, to clean the processing container;
control the lifter pin to raise to receive the dummy substrate at a first position above the stage, after the dummy substrate is loaded into the processing container through the loading/unloading port;
control the lifter pin to locate the dummy substrate at a second position that is the predetermined separation distance lower than the first position; and
control the plasma generator to generate a second plasma, from a second cleaning gas supplied through the gas inlet into the processing container, to clean the processing container.

2. The plasma processing apparatus of claim 1, wherein the controller circuitry is further configured to, after unloading the substrate from the processing container and cleaning the processing container with the second plasma:
control the lifter pin to lower to place the dummy substrate on the placement surface of the stage; and
control the plasma generator to generate a third plasma in the processing container.

3. The plasma processing apparatus of claim 1, wherein cleaning of the processing container removes deposits generated at an outer peripheral portion of the stage during the plasma processing of the dummy substrate with the first and second plasmas.

4. The plasma processing apparatus of claim 1, wherein the plasma processing comprises plasma etching.

5. The plasma processing apparatus of claim 1, wherein the plasma generator further comprises a high-frequency power supply electrically coupled to the stage.

6. The plasma processing apparatus of claim 1, wherein the second plasma generated from the second cleaning gas has a ring shape.

7. The plasma processing apparatus of claim 1, wherein the predetermined separation distance is between 2.3 mm and 5 mm.

8. The plasma processing apparatus of claim 1, wherein the second cleaning gas includes an oxygen-containing gas.

9. The plasma processing apparatus of claim 1, wherein cleaning of the processing container with the first plasma is performed after the substrate is unloaded from the processing container and before the dummy substrate is loaded into the processing container.

10. The plasma processing apparatus of claim 1, wherein cleaning of the processing container with the second plasma is performed with the dummy substrate remaining in the processing container.

11. The plasma processing apparatus of claim 1, wherein the predetermined separation distance is smaller than a thickness of a sheath of the second plasma.

12. The plasma processing apparatus of claim 1, wherein a density of the second plasma is greater around an outer peripheral portion of the dummy substrate than in a central portion of the dummy substrate.

13. The plasma processing apparatus of claim 12, further comprising a focus ring member surrounding an outer periphery of a placement surface of the stage.

14. The plasma processing apparatus of claim 13, wherein the density of the second plasma is greater in an inner peripheral portion of the focus ring member than in an outer peripheral portion of the focus ring member.

15. The plasma processing apparatus of claim 14, wherein the focus ring member comprises single-crystal silicon.

16. The plasma processing apparatus of claim 1, wherein the cleaning of the processing container with the first plasma is performed after the unloading of the substrate from the processing container and before the loading of the dummy substrate into the processing container.

17. A plasma processing apparatus, comprising:

a processing container having a loading/unloading port for a substrate, a gas inlet and a gas exhaust port;

a stage disposed in the processing container;

a lifter pin;

a lifting mechanism for raising and lowering the lifter pin with respect to a position of the stage;

a plasma generator to generate plasma in the processing container;

a memory which stores a predetermined separation distance between a dummy substrate and a placement surface of the stage; and controller circuitry configured to, following a plasma processing of the substrate in the processing container:

control the lifting mechanism to unload the substrate from the processing container;

control the plasma generator to generate a first plasma, from a first cleaning gas supplied through the gas inlet into the processing container, to clean the processing container;

control the lifting mechanism to raise the lifter pin to receive the dummy substrate at a first position above the stage, after the dummy substrate is loaded into the processing container through the loading/unloading port;

control the lifting mechanism to locate the dummy substrate at a second position that is the predetermined separation distance lower than the first position; and control the plasma generator to generate a second plasma, from a second cleaning gas supplied through the gas inlet into the processing container, to clean the processing container.

* * * * *